(12) United States Patent
Wada et al.

(10) Patent No.: US 11,665,882 B2
(45) Date of Patent: May 30, 2023

(54) SEMICONDUCTOR MEMORY DEVICE

(71) Applicant: Kioxia Corporation, Tokyo (JP)

(72) Inventors: Masaharu Wada, Yokohama Kanagawa (JP); Mutsumi Okajima, Yokkaichi Mie (JP); Tsuneo Inaba, Kamakura Kanagawa (JP); Shinji Miyano, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 147 days.

(21) Appl. No.: 17/012,676

(22) Filed: Sep. 4, 2020

(65) Prior Publication Data

US 2021/0225847 A1  Jul. 22, 2021

(30) Foreign Application Priority Data

Jan. 20, 2020 (JP) .............................. JP2020-007038

(51) Int. Cl.
*H01L 27/10* (2006.01)
*H01L 27/108* (2006.01)
*G11C 11/407* (2006.01)

(52) U.S. Cl.
CPC .... *H01L 27/10808* (2013.01); *H01L 27/1082* (2013.01); *H01L 27/10832* (2013.01); *H01L 27/10897* (2013.01); *G11C 11/407* (2013.01)

(58) Field of Classification Search
CPC ......... H01L 27/10805; H01L 27/10894; H01L 27/11507; H01L 27/11504; H01L 27/10808; H01L 27/10832; H01L 27/10897; H01L 27/1082; G11C 11/407
See application file for complete search history.

(56) References Cited

U.S. PATENT DOCUMENTS

| | | | |
|---|---|---|---|
| 8,587,035 B2 * | 11/2013 | Takayama | ........... G11C 11/4097 257/E23.151 |
| 9,105,758 B2 | 8/2015 | Kim | |
| 9,698,272 B1 | 7/2017 | Ikeda | |
| 10,403,381 B2 * | 9/2019 | Quinsat | ................... G11C 19/28 |
| 2002/0075720 A1 * | 6/2002 | Akita | .................. G11C 11/4074 257/E27.097 |

(Continued)

FOREIGN PATENT DOCUMENTS

JP H04-122065 A 4/1992
JP H04-267558 A 9/1992

(Continued)

*Primary Examiner* — Shouxiang Hu
(74) *Attorney, Agent, or Firm* — Foley & Lardner LLP

(57) ABSTRACT

A semiconductor memory device, includes: a first region including a first memory cell array; a second region arranged with the first region; and a third region arranged with the second region and including a second memory cell array. Each memory cell array includes: a field effect transistor above a semiconductor substrate, including a gate, a source, and a drain, the gate being connected to a first wiring, and one of the source and the drain being connected to a second wiring; and a capacitor below the transistor, including a first electrode connected to the other of the source and the drain, a second electrode facing the first electrode, and a third electrode connected to the second electrode and extending to the second region. The second region includes a conductor, the conductor connecting the third electrodes of the memory cell arrays.

4 Claims, 15 Drawing Sheets

(56) References Cited

U.S. PATENT DOCUMENTS

| | | | |
|---|---|---|---|
| 2009/0323399 A1* | 12/2009 | Kajigaya | ............ G11C 11/4099 257/296 |
| 2018/0197949 A1 | 7/2018 | Ramaswamy | |
| 2018/0269283 A1 | 9/2018 | Ramaswamy | |
| 2020/0051849 A1 | 2/2020 | Ramaswamy | |
| 2020/0381290 A1 | 12/2020 | Ramaswamy | |

FOREIGN PATENT DOCUMENTS

| | | |
|---|---|---|
| JP | H05-267616 A | 10/1993 |
| JP | 2017-168623 A | 9/2017 |
| TW | I662686 B | 6/2019 |

* cited by examiner

SEMICONDUCTOR MEMORY DEVICE

CROSS-REFERENCE TO RELATED APPLICATION

This application is based upon and claims the benefit of priority from Japanese Patent Application No. 2020-007038, filed on Jan. 20, 2020; the entire contents of which are incorporated herein by reference.

FIELD

Embodiments relate to a semiconductor memory device.

BACKGROUND

An applied semiconductor memory device has bit lines, word lines, and memory cells (transistors and capacitors) connected to these lines. User selects the bit line and the word line to apply a voltage, resulting in writing data in the memory cell and reading data from the memory cell.

DETAILED DESCRIPTION

Figure 1:
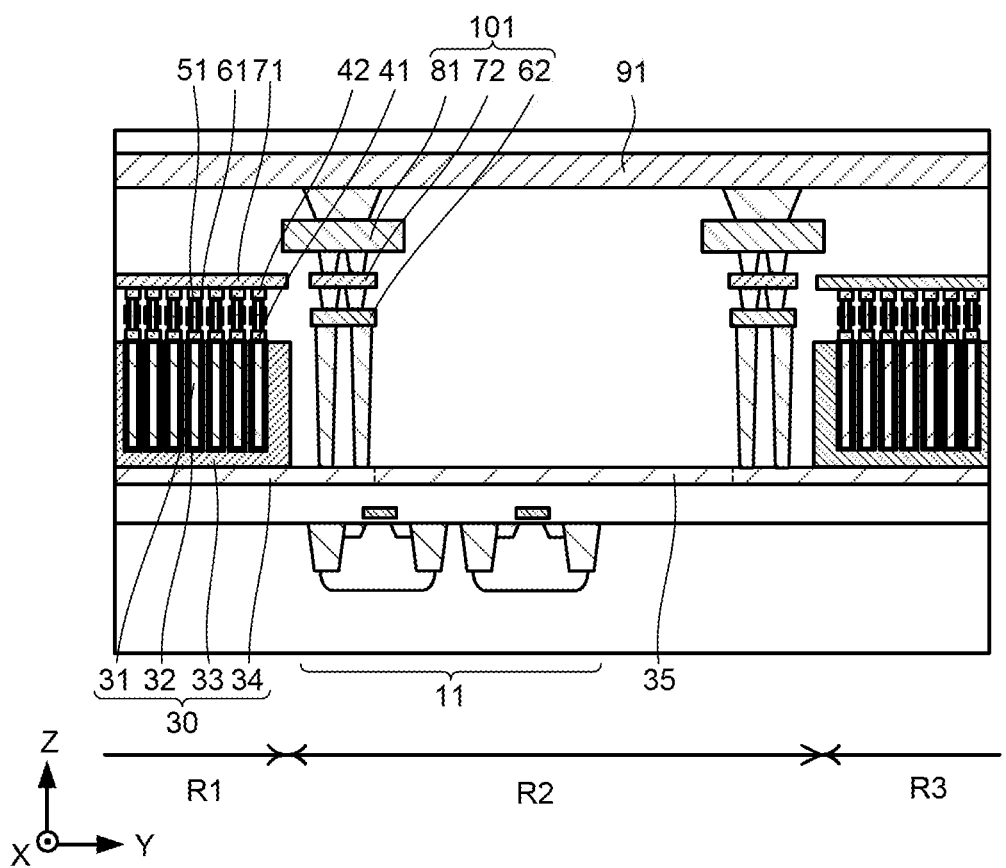
FIG. 1 is a schematic sectional view for explaining a structure example of a semiconductor memory device.

A semiconductor memory device, includes: a first region including a first memory cell array; a second region arranged with the first region; and a third region arranged with the second region and including a second memory cell array. Each memory cell array includes: a field effect transistor above a semiconductor substrate, including a gate, a source, and a drain, the gate being connected to a first wiring, and one of the source and the drain being connected to a second wiring; and a capacitor below the transistor, including a first electrode connected to the other of the source and the drain, a second electrode facing the first electrode, and a third electrode connected to the second electrode and extending to the second region. The second region includes a conductor, the conductor connecting the third electrodes of the memory cell arrays.

Embodiments will be hereinafter described with reference to the drawings. In the drawings, the relation of thickness and planer dimension of each constituent element, a thickness ratio among the constituent elements, and so on can be different from actual ones. Further, in the embodiments, substantially the same constituent elements are denoted by the same reference signs, and a description thereof will be omitted when appropriate.

The present description defines that "connection" includes not only physical connection but also electrical connection, and includes not only direct connection but also indirect connection unless otherwise specified.

First Embodiment

Figure 2:
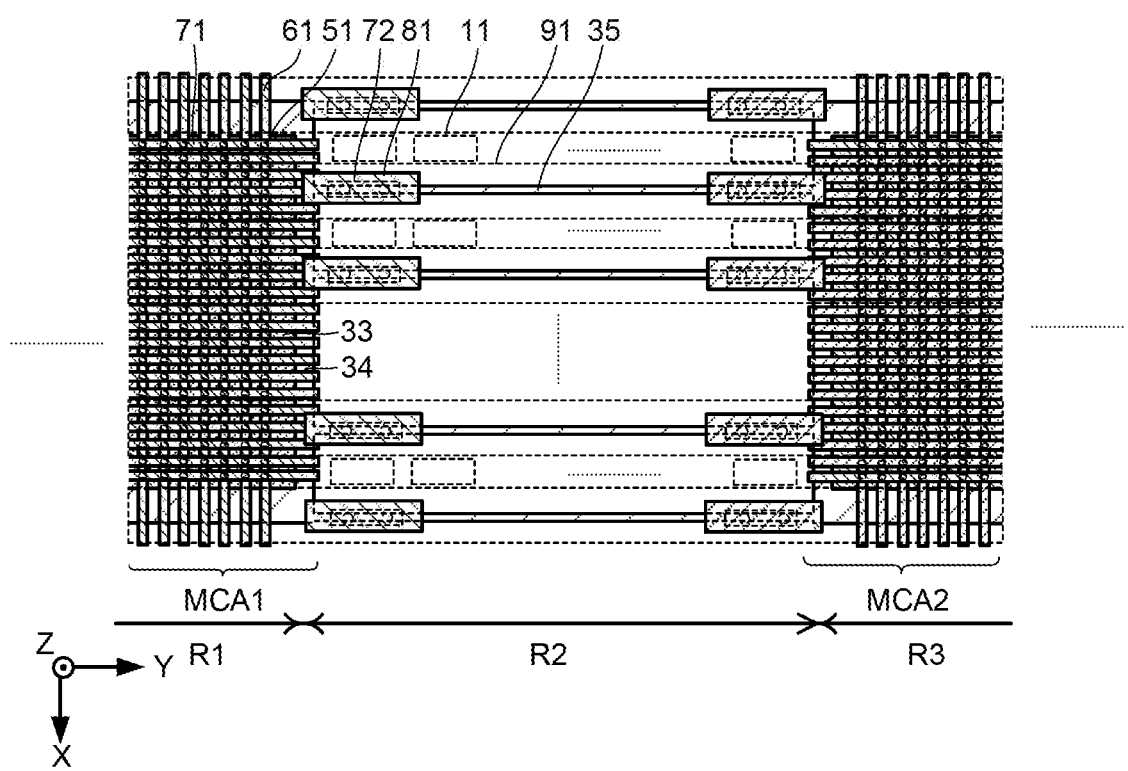
FIG. 2 is a schematic upper view for explaining the structure example of the semiconductor memory device.

FIG. 1 is a schematic sectional view for explaining a structure example of a semiconductor memory device, and illustrates a part of a Y-Z cross section including a Y-axis and a Z-axis orthogonal to the Y-axis of the semiconductor memory device. FIG. 2 is a schematic upper view for explaining the structure example of the semiconductor memory device, and illustrates a part of an X-Y plane including an X-axis orthogonal to the Y-axis and the Y-axis of the semiconductor memory device.

The semiconductor memory device is a dynamic random access memory (DRAM), and has a plurality of memory cell arrays. Each of FIG. 1 and FIG. 2 illustrates a first region R1 including a memory cell array MCA1, a second region R2 arranged with the first region R1, and a third region R3 arranged with the second region R2 and including a memory cell array MCA2. In each of FIG. 1 and FIG. 2, the second region R2 is provided between the first region R1 and the third region R3, but, the configuration is not limited to this arrangement.

Figure 3:
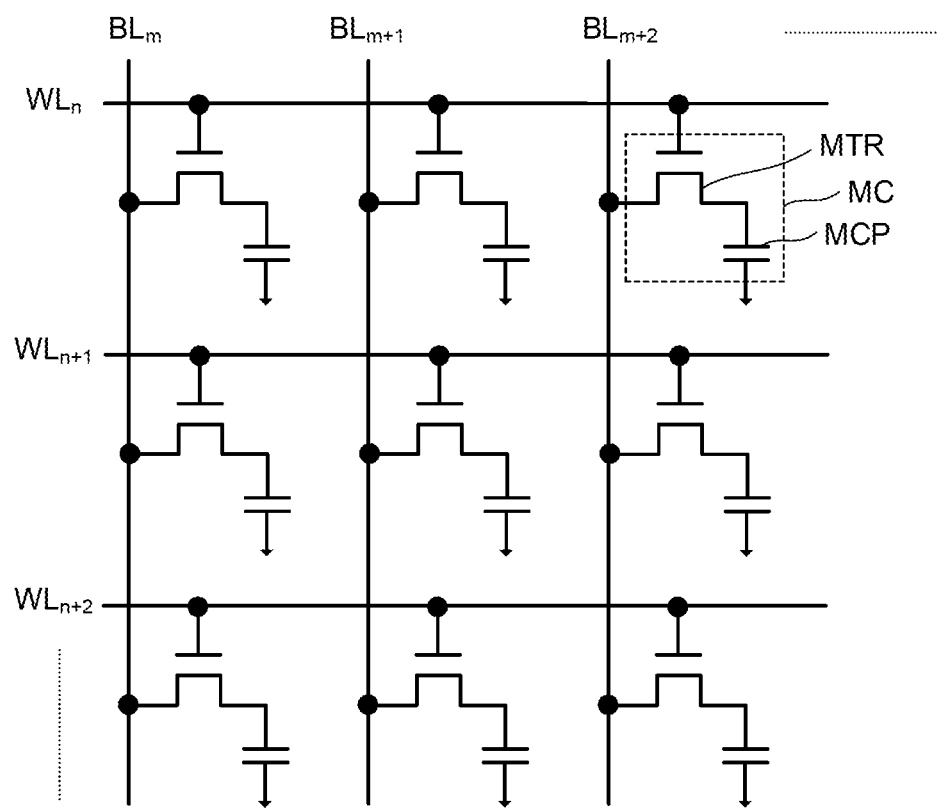
FIG. 3 is a circuit diagram for explaining an example of circuit configuration of a memory cell array.

FIG. 3 is a circuit diagram for explaining an example of circuit configuration of a memory cell array. FIG. 3 illustrates a plurality of memory cells MC, a plurality of word lines WL (word line $WL_n$, word line $WL_{n+1}$, word line $WL_{n+2}$, where n is an integer), and a plurality of bit lines BL (bit line $BL_m$, bit line $BL_{m+1}$, bit line $BL_{m+2}$, where m is an integer).

The plurality of memory cells MC are arrayed in a matrix direction, to form a memory cell array. Each memory cell MC includes a memory transistor MTR of a field effect transistor (FET), and a memory capacitor MCP. A gate of the memory transistor MTR is connected to a corresponding word line WL, and one of a source and a drain is connected to a corresponding bit line BL. One electrode of the memory capacitor MCP is connected to the other of the source and the drain of the memory transistor MTR, and the other electrode is connected to a not-illustrated power supply line that supplies a specific electric potential. The memory cell MC switches the memory transistor MTR by selecting the word line WL and then store electric charge in the memory capacitor MCP from the bit line BL to hold the data. The number of the plurality of memory cells MC is not limited to the number illustrated in FIG. 3.

As illustrated in FIG. 1 and FIG. 2, the first region R1 to the third region R3 include circuits 11, capacitors 30, electrical conductors 35, oxide conductive layers 41, oxide conductive layers 42, field effect transistors 51, wirings 61, electrical conductors 62, wirings 71, electrical conductors 72, electrical conductors 81, and wirings 91. FIG. 2 illustrates the circuits 11 and the wirings 91 represented by dotted lines for the sake of convenience. The constituent elements can be provided with an insulator therebetween. The constituent elements can be formed by using a photolithography technique. The structure examples of the capacitor 30 and the field effect transistor 51 will be further explained while referring to FIG. 4 and FIG. 5 as well. Each of FIG. 4 and FIG. 5 is a schematic view for explaining the structure example of the capacitor 30 and the field effect transistor 51, in which FIG. 4 is a schematic perspective view, and FIG. 5 is a schematic sectional view.

The circuit 11 is provided in the second region R2, and can configure a peripheral circuit such as a sense amplifier. The circuit 11 can have field effect transistors such as P-channel field effect transistors (Pch-FETs) or N-channel field effect transistors (Nch-FETs). The field effect transistors of the circuit 11 can be formed by using a semiconductor substrate such as a single-crystal silicon substrate, and the Pch-FET and the Nch-FET have channel regions, source regions, and drain regions in the semiconductor substrate. The semiconductor substrate can have a conductivity type of P-type. FIG. 1 illustrates field effect transistors of the circuit 11 for the sake of convenience.

The capacitor 30 is provided above the semiconductor substrate and below the field effect transistor 51 in each of the first region R1 and the third region R3, and configures the memory capacitor MCP of the memory cell MC. Each of FIG. 1 and FIG. 2 illustrates a plurality of capacitors 30 that configure the plurality of memory cells MC.

Figure 4:
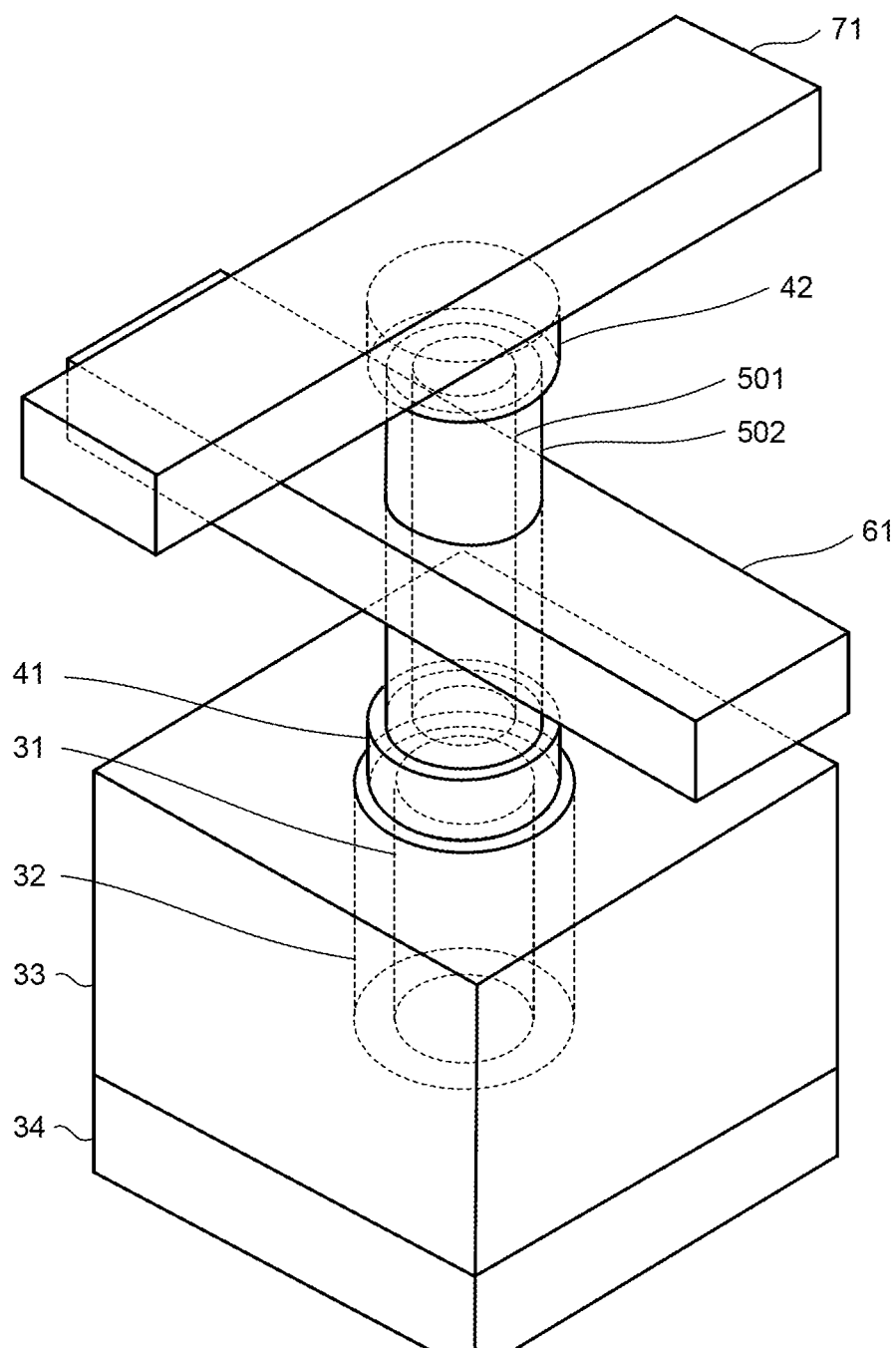
FIG. 4 is a schematic perspective view for explaining a structure example of a capacitor 30 and a field effect transistor 51.
Figure 5:
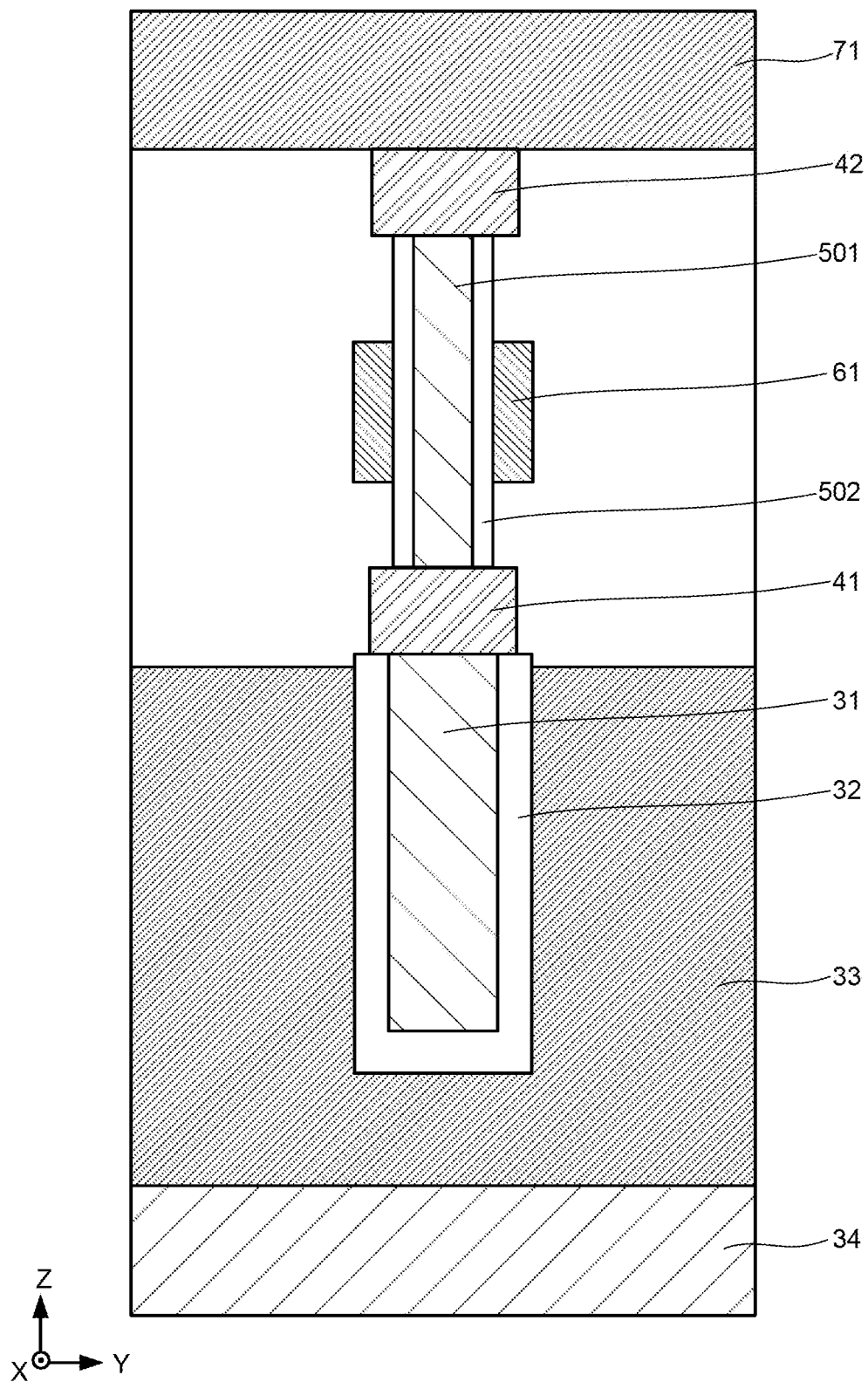
FIG. 5 is a schematic sectional view for explaining the structure example of the capacitor 30 and the field effect transistor 51.

The capacitor 30 is a three-dimensional capacitor such as a so-called pillar-type capacitor or a cylinder-type capacitor, and as illustrated in FIG. 1, FIG. 4, and FIG. 5, it has a cell electrode 31, an insulating film 32, a plate electrode 33, and a plate electrode 34. The cell electrode 31 functions as a first electrode of the memory capacitor MCP. The insulating film 32 functions as a dielectric layer of the memory capacitor MCP, and is provided between the cell electrode 31 and the plate electrode 33. The plate electrode 33 functions as a second electrode of the memory capacitor MCP, and is provided by facing the cell electrode 31. Each of FIG. 1 and FIG. 2 illustrates an example in which a plurality of capacitors 30 provided in each of memory cell arrays mutually share the common plate electrode 33. The plate electrode 34 is connected to the plate electrode 33, and extends to the second region R2. The use of the three-dimensional capacitor reduces an area of the memory cell MC.

As illustrated in FIG. 1 and FIG. 2, the electrical conductor 35 connects the plate electrode 34 of the memory cell array MCA1 and the plate electrode 34 of the memory cell array MCA2. The electrical conductor 35 can include a conductor same as that of the plate electrodes 34 of the memory cell arrays MCA1, MCA2. The electrical conductor in the present description is not limited to a conductor, and it also can include a semiconductor containing an impurity element such as a donor or an acceptor.

As illustrated in FIG. 2, the electrical conductor 35 preferably extends from the plate electrode 34 of the memory cell array MCA1 to the plate electrode 34 of the memory cell array MCA2 without being overlapped with the circuits 11 in the X-Y plane. The shape of the electrical conductor 35 is not limited to a shape of straight line, and it can also be a curved shape.

Each of the plate electrode 34 and the electrical conductor 35 preferably has a sheet resistance smaller than that of the plate electrode 33. Each of the plate electrode 34 and the electrical conductor 35 can includes a material such as tungsten or titanium nitride.

As illustrated in FIG. 1, FIG. 4, and FIG. 5, the oxide conductive layer 41 is provided by being brought into contact with the cell electrode 31. The oxide conductive layer 41 can contain a metal oxide such as indium-tin-oxide (ITO).

As illustrated in FIG. 1 and FIG. 2, the field effect transistor 51 is provided above the semiconductor substrate and above the capacitor 30 in each of the first region R1 and the third region R3, and configures the memory transistor MTR of the memory cell MC. Each of FIG. 1 and FIG. 2 illustrates a plurality of field effect transistors 51 configuring a plurality of memory cells MC.

As illustrated in FIG. 4 and FIG. 5, the field effect transistor 51 includes a channel layer 501 containing an oxide semiconductor such as metal oxide, and a gate insulating film 502 surrounding the channel layer 501. One end in the Z-axis direction of the channel layer 501 is connected to the wiring 71 via the oxide conductive layer 42 to function as one of a source and a drain of the field effect transistor 51, and the other end is connected to the oxide conductive layer 41 to function as the other of the source and the drain of the field effect transistor 51. At this time, the oxide conductive layer 41 is provided between the cell electrode 31 of the capacitor 30 and the channel layer 501 of the field effect transistor 51, to function as the other of the source electrode and the drain electrode of the field effect transistor 51. The oxide conductive layer 41 contains the metal oxide, similarly to the channel layer 501 of the field effect transistor 51, to reduce a connection resistance between the field effect transistor 51 and the oxide conductive layer 41.

The channel layer 501 can contain indium (In). The channel layer 501 can contains the combination of indium oxide and gallium oxide, the combination of indium oxide and zinc oxide, or the combination of indium oxide and tin oxide. The channel layer 501 can contain an oxide containing indium, gallium, and zinc (indium-gallium-zinc-oxide), so-called IGZO (InGaZnO).

The gate insulating film 502 can contain oxide or oxynitride (silicon oxide, as one example).

As illustrated in FIG. 4 and FIG. 5, the wiring 61 is provided by facing the channel layer 501 with the gate insulating film 502 therebetween, and functions as a gate electrode of the field effect transistor 51.

As illustrated in FIG. 4, the field effect transistor 51 is a so-called surrounding gate transistor (SGT) in which the gate electrode is arranged by surrounding the channel layer 501. The use of the SGT reduces an area of the semiconductor memory device.

The field effect transistor having the channel layer containing the oxide semiconductor has an off-leakage current lower than that of the field effect transistor in the semiconductor substrate. This transistor can hold data in the memory cell MC for a long time to reduce the number of times of the refresh operation. This transistor further can be formed in a low-temperature process. This prevents application of thermal stress to the capacitor 30.

As illustrated in FIG. 1 and FIG. 2, the wiring 61 is provided in each of the first region R1 and the third region R3, extends in the X-axis direction, and forms the word line WL. Each of FIG. 1 and FIG. 2 illustrates a plurality of wirings 61. The number of the plurality of wirings 61 is not limited to the number illustrated in FIG. 2.

The wiring 61 can contain metal, a metal compound, or a semiconductor. The wiring 61 can contain at least one material selected from the group consisting of tungsten (W), titanium (Ti), titanium nitride (TiN), molybdenum (Mo), cobalt (Co), and ruthenium (Ru).

As illustrated in FIG. 1, the electrical conductor 62 is provided between the plate electrode 34 and the wiring 91 in the second region R2. The electrical conductor 62 is connected to the plate electrode 34 via vias. The electrical conductor 62 can be provided in a layer same as that of the wiring 61, and can be formed through a process same as that of the wiring 61 by processing one conductive layer.

As illustrated in FIG. 1, FIG. 4, and FIG. 5, the oxide conductive layer 42 is provided by being brought into contact with the channel layer 501 of the field effect transistor 51, and functions as one of the source electrode and the drain electrode of the field effect transistor 51. The oxide conductive layer 42 can contain metal oxide such as indium-tin-oxide (ITO). The oxide conductive layer 42 contains the metal oxide similarly to the channel layer 501 of the field effect transistor 51, to reduce a connection resistance between the field effect transistor 51 and the oxide conductive layer 42.

As illustrated in FIG. 1 and FIG. 2, the wiring 71 is provided above the wiring 61 in each of the first region R1 and the third region R3, intersects the wiring 61, and extends in the Y-axis direction to form the bit line BL. FIG. 2 illustrates a plurality of wirings 71. The number of the plurality of wirings 71 is not limited to the number illustrated in FIG. 2.

As illustrated in FIG. 4 and FIG. 5, the wiring 71 is provided on the oxide conductive layer 42 above the field effect transistor 51, and is connected to the channel layer 501 of the field effect transistor 51 via the oxide conductive layer 42. The oxide conductive layer 42 functions as one of the source electrode and the drain electrode of the field effect transistor 51.

As illustrated in FIG. 1, the electrical conductor 72 is provided between the electrical conductor 62 and the wiring 91 in the second region R2. The electrical conductor 72 is connected to the electrical conductor 62 via vias. The electrical conductor 72 can be provided in a layer same as that of the wiring 71 and can be formed through a process same as that of the wiring 71 by processing one conductive layer. FIG. 2 illustrates a plurality of electrical conductors 72.

As illustrated in FIG. 1, the electrical conductor 81 is provided between the electrical conductor 72 and the wiring 91 in the second region R2, and connects the electrical conductor 72 and the wiring 91. The electrical conductor 81 is connected to the electrical conductor 72 via vias. The electrical conductor 81 can contains copper. FIG. 2 illustrates a plurality of electrical conductors 81.

The electrical conductor 62, the electrical conductor 72, and the electrical conductor 81 respectively define a first portion, a second portion, and a third portion of a connection 101 that connects the plate electrode 34 and the wiring 91. Although FIG. 1 and FIG. 2 illustrate a plurality of connections 101, the number of the plurality of connections 101 is not limited to the number illustrated in FIG. 1 and FIG. 2. At least one of the plurality of connections 101 can be provided above the electrical conductor 35, and connect the electrical conductor 35 and the wiring 91 via the electrical conductor 62, the electrical conductor 72, and the electrical conductor 81.

Figure 6:
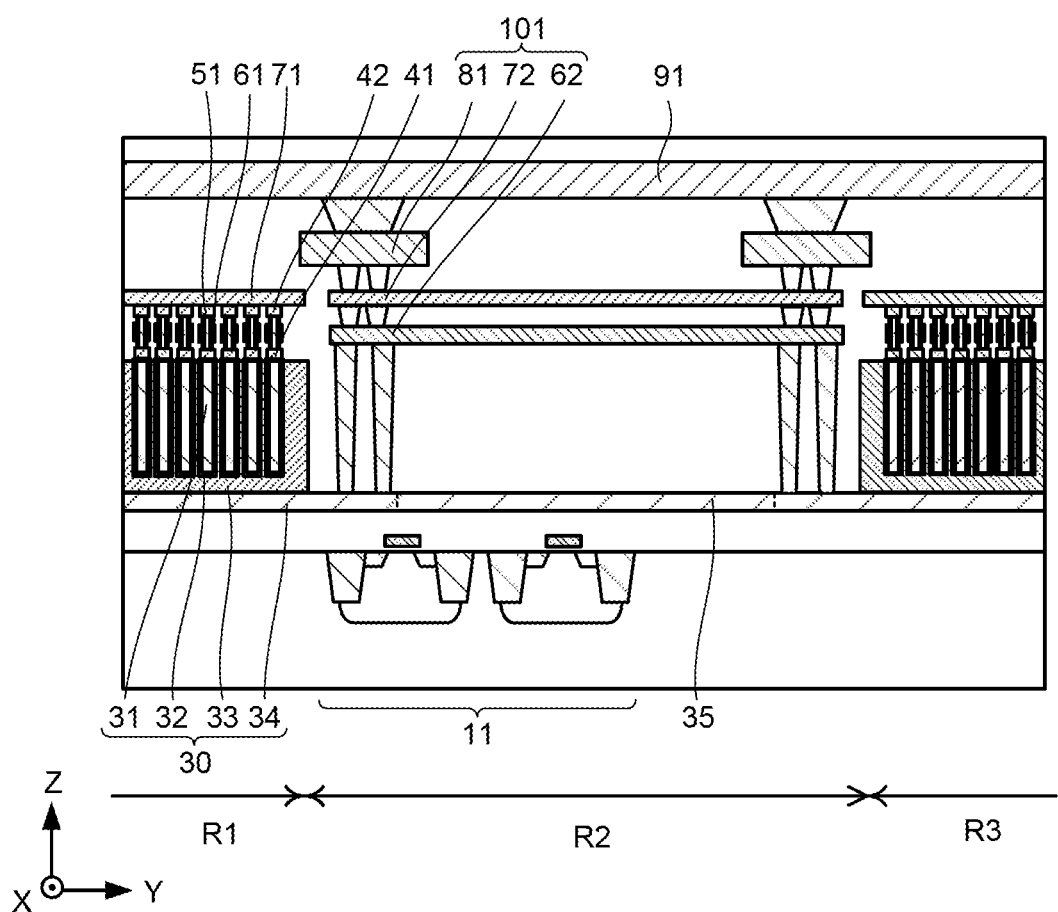
FIG. 6 is a schematic sectional view for explaining another structure example of the semiconductor memory device.

At least one portions selected from the group consisting of the first portions (the electrical conductors 62) of the connections 101, the second portions (the electrical conductors 72) of the connections 101, and the third portions (the electrical conductors 81) of the connections 101, can be mutually connected. In other words, the connections 101 can be connected through at least one portions selected from the group consisting of mutually common first portions (the electrical conductors 62), mutually common second portions (the electrical conductors 72), and mutually common third portions (the electrical conductors 81). FIG. 6 is a schematic sectional view for explaining another structure example of the semiconductor memory device, and illustrates a part of a Y-Z cross section of the semiconductor memory device. FIG. 6 illustrates an example in which the electrical conductors 62 of the plurality of connections 101 are mutually connected, and the electrical conductors 72 of the plurality of connections 101 are mutually connected.

The wiring 91 is provided above the memory cell array MCA1 and above the memory cell array MCA2, and extends to the second region R2. The wiring 91 can extend in the Y-axis direction in the first region R1 to the third region R3, to form a power supply line that supplies a specific electric potential. The wiring 91 is connected to the electrical conductor 81 via a via, as illustrated in FIG. 1. FIG. 2 illustrates a plurality of wirings 91.

As described above, the semiconductor memory device according to the present embodiment includes the electrical conductor that connects the plate electrode of the memory capacitors MCP of one memory cell array and the plate electrode of the memory capacitors MCP of another memory cell array.

When the memory capacitor MCP is provided below the memory transistor MTR to decrease an area of the memory cell array, since a connection path between the wiring such as the power supply line provided above the memory cell array and the plate electrode is long, a via with high aspect ratio is required, which increases the connection resistance. This causes a malfunction of the semiconductor memory device. In contrast, the semiconductor memory device according to the present embodiment can connect mutual plate electrodes of the memory cell arrays to lower the electrical resistance between the plate electrodes to keep the electric potential of the plate electrodes in a proper manner, resulting in preventing the malfunction.

Second Embodiment

Figure 7:
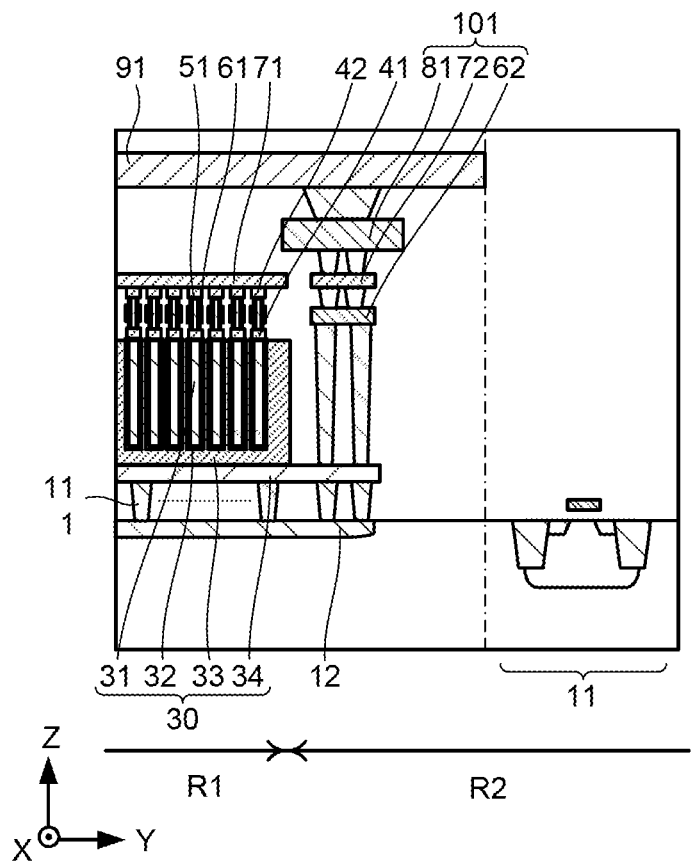
FIG. 7 is a schematic sectional view for explaining another structure example of the semiconductor memory device.
Figure 8:
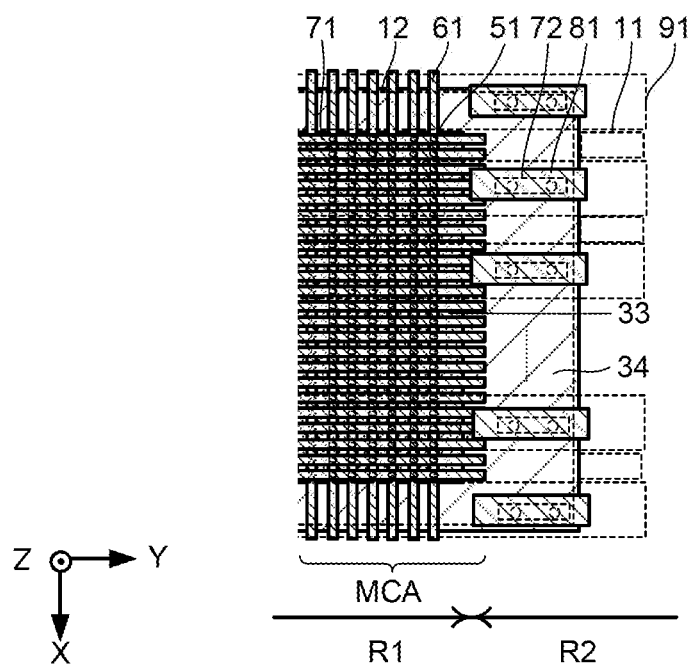
FIG. 8 is a schematic upper view for explaining the other structure example of the semiconductor memory device.

FIG. 7 is a schematic sectional view for explaining another structure example of the semiconductor memory device, and illustrates a part of a Y-Z cross section of the semiconductor memory device. FIG. 8 is a schematic upper view for explaining the other structure example of the semiconductor memory device, and illustrates a part of an X-Y plane of the semiconductor memory device.

Each of FIG. 7 and FIG. 8 illustrates a first region R1 including a memory cell array MCA, and a second region R2 arranged with the first region R1. The first region R1 and the second region R2 have circuits 11, a well 12, capacitors 30, oxide conductive layers 41, oxide conductive layers 42, field effect transistors 51, wirings 61, electrical conductors 62, wirings 71, electrical conductors 72, electrical conductors 81, and wirings 91. The circuit 11, the capacitor 30, the oxide conductive layer 41, the oxide conductive layer 42, the field effect transistor 51, the wiring 61, the electrical conductor 62, the wiring 71, the electrical conductor 72, the electrical conductor 81, and the wiring 91 are the same as the circuit 11, the capacitor 30, the oxide conductive layer 41, the oxide conductive layer 42, the field effect transistor 51, the wiring 61, the electrical conductor 62, the wiring 71, the electrical conductor 72, the electrical conductor 81, and the wiring 91, respectively, of the first embodiment, and thus explanation thereof will be omitted. FIG. 7 illustrates the field effect transistor of the circuit 11 for the sake of convenience.

The well 12 is an electrical conductor provided in the semiconductor substrate, similarly to the circuit 11. The well 12 is provided below the plate electrode 34 of the capacitors 30. The well 12 contains an impurity element such as a donor or an acceptor, and has N-type conductivity of or P-type conductivity. The well 12 can be provided with a silicide layer thereon. The well 12 can be formed with the source region and the drain region of the field effect transistor of the circuit 11 by a process.

As illustrated in FIG. 7, the well 12 is connected to the plate electrode 34 of the capacitors 30 via contacts 111 between the well 12 and the plate electrode 34. As illustrated in FIG. 7 and FIG. 8, the well 12 can extend from the first region R1 to the second region R2, and can be connected to the plate electrode 34 via the contacts 111 in the second region R2.

Figure 9:
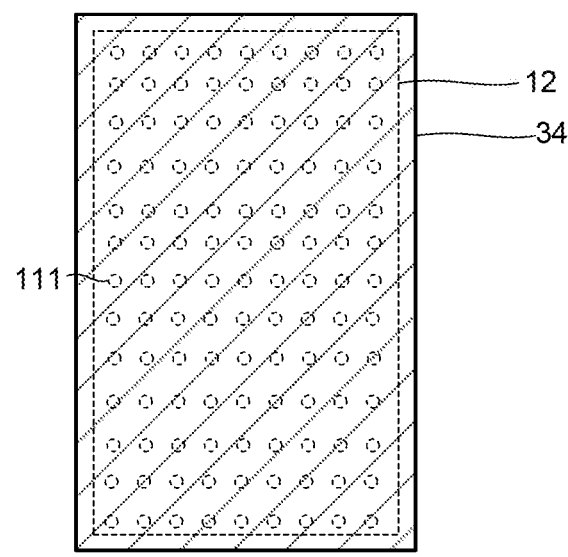
FIG. 9 is a schematic plan view for explaining a shape example of a contact 111.
Figure 10:
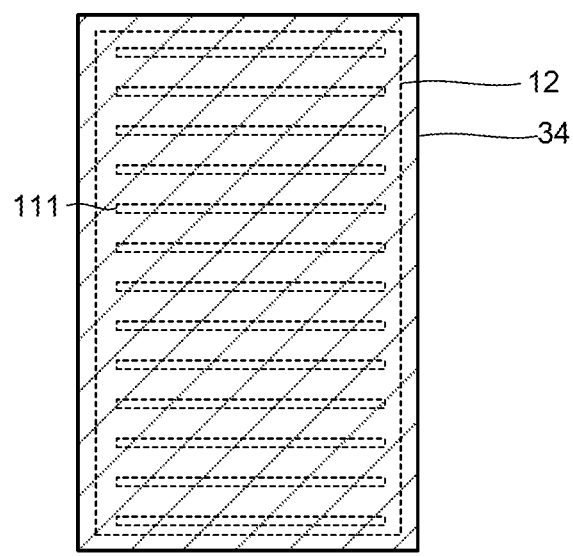
FIG. 10 is a schematic plan view for explaining a shape example of the contact 111.
Figure 11:
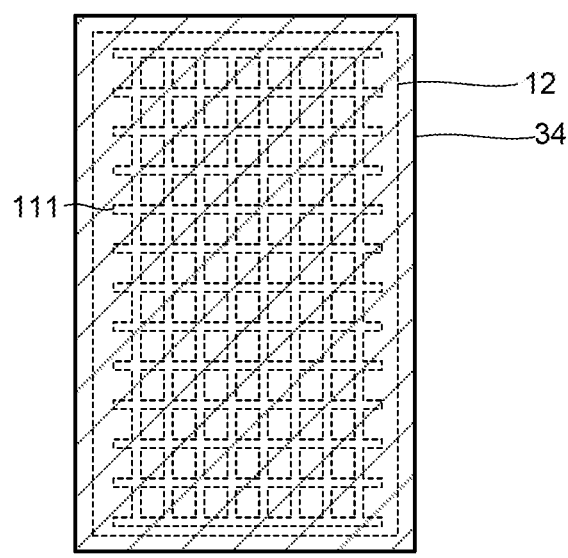
FIG. 11 is a schematic plan view for explaining a shape example of the contact 111.

A shape of the contact 111 is not particularly limited. Each of FIG. 9 to FIG. 11 is a schematic plan view for explaining a shape example of the contact 111. FIG. 9 illustrates a plurality of contacts 111 in a dot shape, FIG. 10 illustrates a plurality of contacts 111 in a line shape, and FIG. 11 illustrates the contact 111 in a lattice shape. An increase of an area of the contact 111 reduces a connection resistance between the well 12 and the plate electrode 34.

As described above, the semiconductor memory device according to the present embodiment is provided with the electrical conductor including the well connected to the plate electrode of the memory capacitors MCP of the memory cell array.

When the memory capacitor MCP is provided below the memory transistor MTR to decrease an area of the memory cell array, since a connection path between the wiring such as the power supply line provided above the memory cell array and the plate electrode is long, a via with high aspect ratio is required, which increases the connection resistance. This causes a malfunction of the semiconductor memory device. In contrast, The semiconductor memory device according to the present embodiment can connect the plate electrode of the memory capacitors MCP and the well provided in the semiconductor substrate to lower the electrical resistance of the plate electrode to prevent variation in potential distribution in the plate electrode, resulting in that preventing the malfunction.

The present embodiment can be appropriately combined with another embodiment.

Third Embodiment

Figure 12:
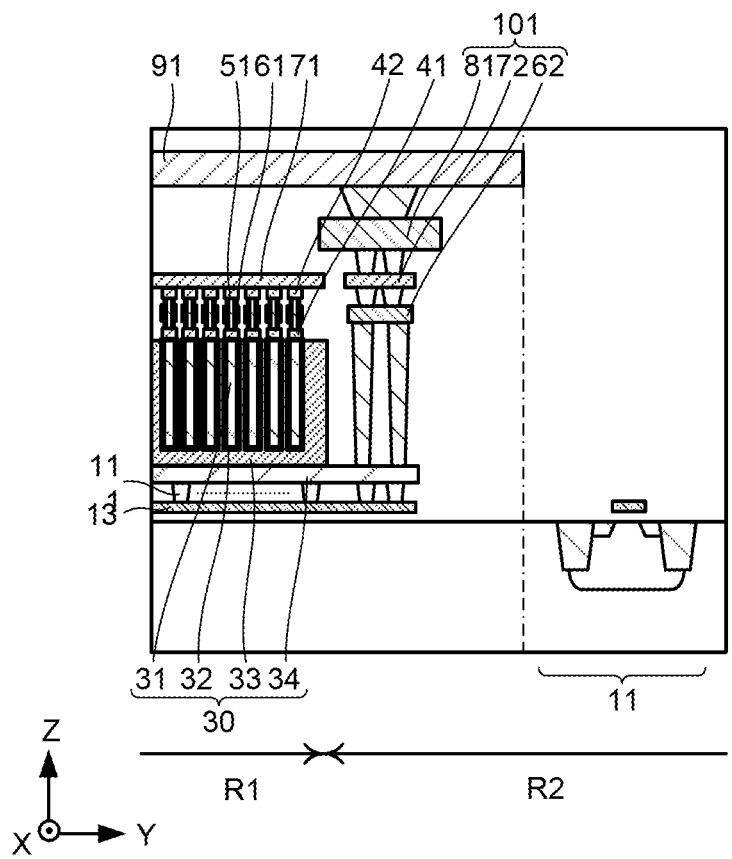
FIG. 12 is a schematic sectional view for explaining another structure example of the semiconductor memory device.
Figure 13:
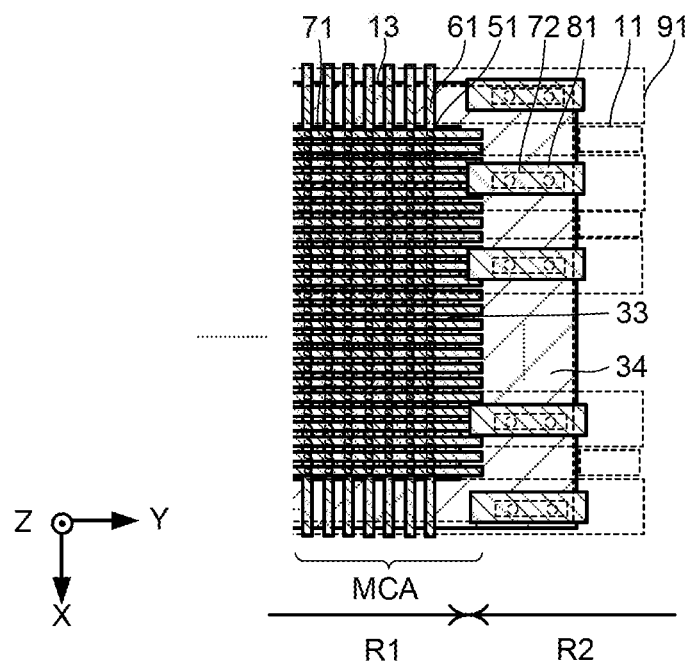
FIG. 13 is a schematic upper view for explaining the other structure example of the semiconductor memory device.

FIG. 12 is a schematic sectional view for explaining another structure example of the semiconductor memory device, and illustrates a part of a Y-Z cross section of the semiconductor memory device. FIG. 13 is a schematic upper view for explaining the other structure example of the semiconductor memory device, and illustrates a part of an X-Y plane of the semiconductor memory device.

Each of FIG. 12 and FIG. 13 illustrates a first region R1 including a memory cell array MCA, and a second region R2 arranged with the first region R1. The first region R1 and the second region R2 have circuits 11, a conductor 13, capacitors 30, oxide conductive layers 41, oxide conductive layers 42, field effect transistors 51, wirings 61, electrical conductors 62, wirings 71, electrical conductors 72, electrical conductors 81, and wirings 91. The circuit 11, the capacitor 30, the oxide conductive layer 41, the oxide conductive layer 42, the field effect transistor 51, the wiring 61, the electrical conductor 62, the wiring 71, the electrical conductor 72, the electrical conductor 81, and the wiring 91 are the same as the circuit 11, the capacitor 30, the oxide conductive layer 41, the oxide conductive layer 42, the field effect transistor 51, the wiring 61, the electrical conductor 62, the wiring 71, the electrical conductor 72, the electrical conductor 81, and the wiring 91, respectively, of the first embodiment, and thus explanation thereof will be omitted. Further, FIG. 12 illustrates the field effect transistor of the circuit 11 for the sake of convenience.

The electrically conductive member 13 is an electrical conductor provided in a same layer level as of the gate electrode of the field effect transistor of the circuit 11. The electrically conductive member 13 is provided below the plate electrode 34 of the capacitors 30. The electrically conductive member 13 can be formed with the gate electrode of the field effect transistor by a process including processing one conductive layer. The electrically conductive member 13 can contain a material such as tungsten, titanium nitride, or polysilicon.

The electrically conductive member 13 is connected to the plate electrode 34 of the capacitors 30 via contacts 111 between the electrically conductive member 13 and the plate electrode 34. As illustrated in FIG. 12 and FIG. 13, the electrically conductive member 13 can extend from the first region R1 to the second region R2, and can be connected to the plate electrode 34 via the contacts 111 in the second region R2.

Figure 14:
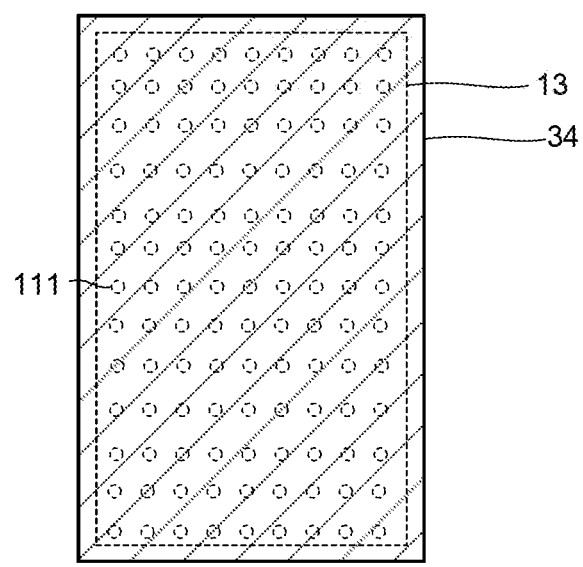
FIG. 14 is a schematic plan view for explaining a shape example of a conductor 13.
Figure 15:
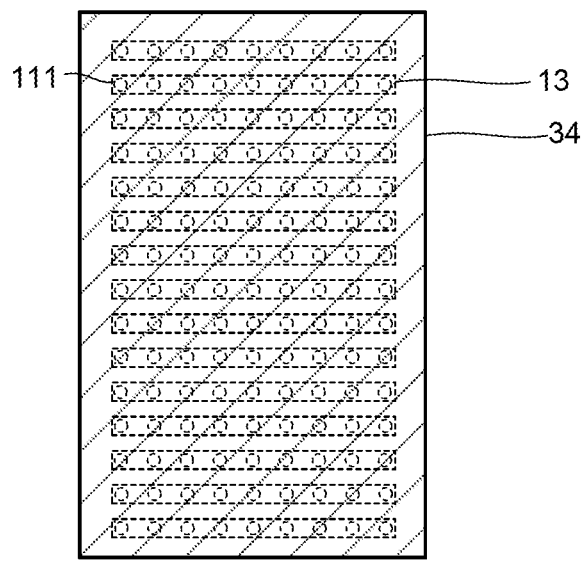
FIG. 15 is a schematic plan view for explaining a shape example of the conductor 13.
Figure 16:
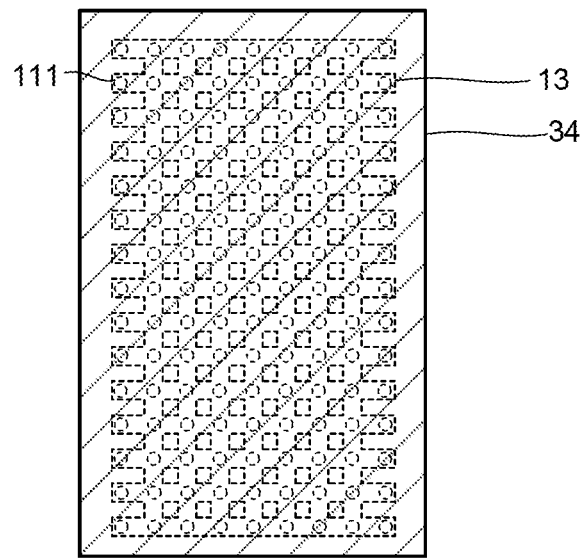
FIG. 16 is a schematic plan view for explaining a shape example of the conductor 13.

A shape of the electrically conductive member 13 is not particularly limited. Each of FIG. 14 to FIG. 16 is a schematic plan view for explaining a shape example of the electrically conductive member 13. FIG. 14 illustrates the electrically conductive member 13 in a flat plate shape, FIG. 15 illustrates a plurality of electrically conductive members 13 in a line shape, and FIG. 16 illustrates the electrically conductive member 13 in a lattice shape. By enlarging an area of the electrically conductive member 13, it is possible to reduce a connection resistance between the electrically conductive member 13 and the plate electrode 34.

As described above, the semiconductor memory device according to the present embodiment is provided with the electrical conductor including the electrically conductive member connected to the plate electrode of the memory capacitors MCP of the memory cell array.

When the memory capacitor MCP is provided below the memory transistor MTR to decrease an area of the memory cell array, since a connection path between the wiring such as the power supply line provided above the memory cell array and the plate electrode is long, a via with high aspect ratio is required, which increases the connection resistance. This causes a malfunction of the semiconductor memory device. In contrast, The semiconductor memory device according to the present embodiment can connect the plate electrode of the memory capacitors MCP and the conductor to lower the electrical resistance of the plate electrode to prevent variation in potential distribution in the plate electrode, resulting in preventing the malfunction.

The present embodiment can be appropriately combined with another embodiment.

Fourth Embodiment

Figure 17:
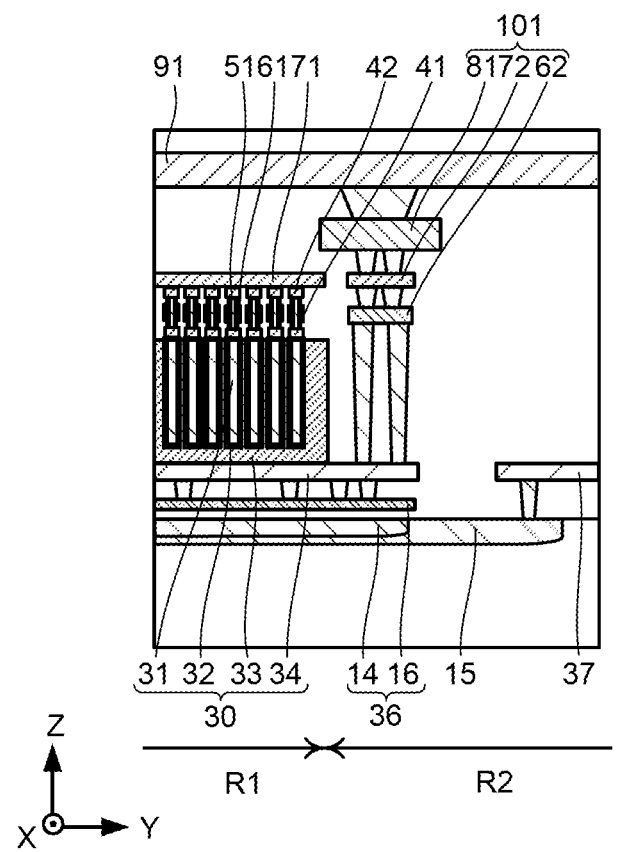
FIG. 17 is a schematic sectional view for explaining another structure example of the semiconductor memory device.
Figure 18:
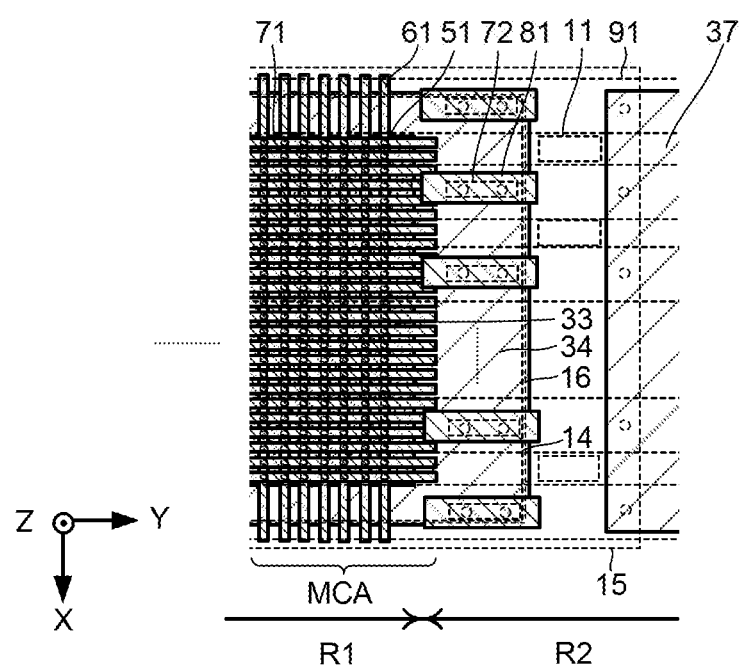
FIG. 18 is a schematic upper view for explaining the other structure example of the semiconductor memory device.

FIG. 17 is a schematic sectional view for explaining another structure example of the semiconductor memory device, and illustrates a part of a Y-Z cross section of the semiconductor memory device. FIG. 18 is a schematic upper view for explaining the other structure example of the semiconductor memory device, and illustrates a part of an X-Y plane of the semiconductor memory device.

Each of FIG. 17 and FIG. 18 illustrates a first region R1 including a memory cell array MCA, and a second region R2 arranged with the first region R1. The first region R1 and the second region R2 have circuits 11, a well 14, a well 15, a conductor 16, capacitors 30, a capacitor 36, an electrode 37, oxide conductive layers 41, oxide conductive layers 42, field effect transistors 51, wirings 61, electrical conductors 62, wirings 71, electrical conductors 72, electrical conductors 81, and wirings 91. The circuit 11, the capacitor 30, the oxide conductive layer 41, the oxide conductive layer 42, the field effect transistor 51, the wiring 61, the electrical conductor 62, the wiring 71, the electrical conductor 72, the electrical conductor 81, and the wiring 91 are the same as the circuit 11, the capacitor 30, the oxide conductive layer 41, the oxide conductive layer 42, the field effect transistor 51, the wiring 61, the electrical conductor 62, the wiring 71, the electrical conductor 72, the electrical conductor 81, and the wiring 91, respectively, of the first embodiment, and thus explanation thereof will be omitted. Further, FIG. 18 illustrates the well 14, the well 15, and the conductor 16 by dotted lines for the sake of convenience.

The well 14 is an electrical conductor provided in the semiconductor substrate, similarly to the circuit 11. The well 14 is provided below the plate electrode 34 of the capacitors 30. The well 14 contains an impurity element of one of a donor and an acceptor, and has a conductivity type of N-type or P-type. It is also possible that a silicide layer is provided on a surface of the well 14. As illustrated in FIG. 17 and FIG. 18, the well 14 can extend from the first region R1 to the second region R2. The well 14 can be formed with the source region and the drain region of the field effect transistor of the circuit 11 by a process.

The well 15 is an electrical conductor provided in the semiconductor substrate, similarly to the circuit 11. As illustrated in FIG. 17, the well 15 is provided below the conductor 16, and it surrounds the well 14. The well 15 contains an impurity element of the other of the donor and the acceptor, and has the N-type conductivity or the P-type conductivity.

The well 14 and the well 15 have mutually different conductivity types. When the well 14 has the N-type conductivity, the well 15 can have the P-type conductivity, and when the well 14 has the P-type conductivity type, the well 15 can have the N-type conductivity.

As illustrated in FIG. 17 and FIG. 18, the well 15 extends from the first region R1 to the second region R2, and is connected to the electrode 37 via contacts in the second region R2. A shape of the contact is not particularly limited.

The conductor 16 is an electrical conductor provided in a same layer level as the gate electrode of the field effect transistor of the circuit 11. The conductor 16 is provided below the plate electrode 34. The conductor 16 can be formed with the gate electrode of the field effect transistor by a process including processing one conductive layer. The conductor 16 can contain a material such as tungsten, titanium nitride, or polysilicon.

The conductor 16 is connected to the plate electrode 34 of the capacitors 30 via contacts. As illustrated in FIG. 17 and FIG. 18, the conductor 16 can extend from the first region R1 to the second region R2, and can be connected to the plate electrode 34 via the contacts in the second region R2. A shape of the conductor 16 is not particularly limited.

The well 14 and the conductor 16 configure the capacitor 36 together with an insulator between the well 14 and the conductor 16. The capacitor 36 is a metal-insulator-semiconductor capacitor (MIS capacitor) having an electrode including the conductor 16 and an electrode including the well 14. A capacitance of the capacitor 36 is larger than a capacitance of the capacitor 30, for example.

The electrode 37 is provided above the well 15, and connected to the well 15 via contacts. The electrode 37 can be connected to a not-illustrated wiring for suppling a specific electric potential. The electrode 37 can be formed with the plate electrode 34 by a process including processing one conductive layer.

As described above, the semiconductor memory device according to the present embodiment includes the MIS capacitor connected to the plate electrode of the memory capacitors MCP of the memory cell array.

When the memory capacitor MCP is provided below the memory transistor MTR to decrease an area of the memory cell array, since a connection path between the wiring such as the power supply line provided above the memory cell array and the plate electrode is long, a via with high aspect ratio is required, which increases the connection resistance. This causes a malfunction of the semiconductor memory device. In contrast, The semiconductor memory device according to the present embodiment can connect the MIS capacitor to the plate electrode of the memory capacitors MCP to reduce a noise, resulting in preventing the malfunction.

The present embodiment can be appropriately combined with another embodiment.

While certain embodiments of the present invention have been described, these embodiments have been presented by way of example only, and are not intended to limit the scope of the inventions. The novel embodiments described herein can be embodied in a variety of other forms; furthermore, various omissions, substitutions and changes can be made therein without departing from the spirit of the inventions. The accompanying claims and their equivalents are intended to cover such forms or modifications as would fall within the scope and spirit of the inventions.

What is claimed is:

1. A semiconductor memory device, comprising:
   a first region including a first memory cell array;
   a second region arranged with the first region in a first direction; and
   a third region arranged with the second region in the first direction and including a second memory cell array,
   the second region being between the first region and the third region in the first direction, and
   each memory cell array including:
   a field effect transistor above a semiconductor substrate, including a gate, a source, and a drain, the gate being connected to a first wiring, and one of the source and the drain being connected to a second wiring; and
   a capacitor below the transistor, including a first electrode connected to the other of the source and the drain, a second electrode facing the first electrode, and a third electrode connected to the second electrode and extending to the second region, wherein the second region includes a conductor, the conductor connecting the third electrodes of the memory cell arrays, the second region includes a plurality of first connections, each first connection connecting a third wiring and the third electrode, and the third wiring being above the memory cell arrays and extending to the second region, and each first connection includes:

a first portion provided between the third electrode and the third wiring and connected to the third electrode;

a second portion provided between the first portion and the third wiring and connected to the first portion; and a third portion provided between the second portion and the third wiring and connecting the second portion and the third wiring, the second region including at least one second connection selected from the group consisting of a second connection between the first portions, a second connection between the second portions, and a second connection between the third portions, wherein the second connection is located between the third electrode and the third wiring.

2. The device according to claim 1, wherein
the transistor has a channel layer containing an oxide semiconductor.

3. The device according to claim 2, wherein
the oxide semiconductor includes indium-gallium-zinc-oxide.

4. The device according to claim 1, wherein
the device is a dynamic random access memory.

\* \* \* \* \*